United States Patent
Leidl et al.

(10) Patent No.: US 12,116,269 B2
(45) Date of Patent: Oct. 15, 2024

(54) MICROELECTROMECHANICAL MICROPHONE HAVING A ROBUST BACKPLATE

(71) Applicant: TDK Corporation, Tokyo (JP)

(72) Inventors: Anton Leidl, Munich (DE); Pirmin Rombach, Munich (DE)

(73) Assignee: TDK Corporation, Tokyo (JP)

( * ) Notice: Subject to any disclaimer, the term of this patent is extended or adjusted under 35 U.S.C. 154(b) by 329 days.

(21) Appl. No.: 17/225,581

(22) Filed: Apr. 8, 2021

(65) Prior Publication Data

US 2021/0331914 A1   Oct. 28, 2021

Related U.S. Application Data

(60) Provisional application No. 63/015,021, filed on Apr. 24, 2020.

(51) Int. Cl.
*B81B 7/00* (2006.01)
*B81B 3/00* (2006.01)

(52) U.S. Cl.
CPC ............ *B81B 7/0061* (2013.01); *B81B 3/007* (2013.01); *B81B 2201/0257* (2013.01); *B81B 2203/0127* (2013.01)

(58) Field of Classification Search
CPC .............. B81B 7/0061; B81B 3/007; B81B 2201/0257; B81B 2203/0127
See application file for complete search history.

(56) References Cited

U.S. PATENT DOCUMENTS

| | | |
|---|---|---|
| 2013/0161702 A1 | 6/2013 | Chen |
| 2016/0192082 A1 | 6/2016 | Uchida et al. |
| 2016/0360322 A1 | 12/2016 | Liu et al. |
| 2017/0013363 A1 | 1/2017 | Berger et al. |
| 2018/0152792 A1* | 5/2018 | Hoekstra ............... H04R 19/04 |
| 2020/0223687 A1* | 7/2020 | Lin ..................... B81C 1/00309 |
| 2020/0290864 A1* | 9/2020 | Fueldner .............. H04R 19/005 |

* cited by examiner

*Primary Examiner* — Samuel A Gebremariam
(74) *Attorney, Agent, or Firm* — Slater Matsil, LLP (57) ABSTRACT

Technologies are provided for microelectromechanical microphones that can be robust to substantial pressure changes in the environment in which the micromechanical microphones operate. In some embodiments, a microelectromechanical microphone device can include a rigid plate defining multiple openings that permit passage of a pressure wave. The microelectromechanical microphone device also includes a stiffener member integrated into the rigid plate. The stiffener member causes stress to be distributed within the rigid plate in response to the pressure wave inducing deformation of the rigid plate.

14 Claims, 10 Drawing Sheets

MICROELECTROMECHANICAL MICROPHONE HAVING A ROBUST BACKPLATE

PRIORITY APPLICATION

This application claims the benefit of and priority to U.S. Provisional Application No. 63/015,021, filed Apr. 24, 2020, the content of which application is hereby incorporated by reference herein in its entirety.

BACKGROUND

There are situations in which a diaphragm of a microelectromechanical microphone can be subjected to sudden, large changes in air pressure. For example, the microelectromechanical microphone can fall on a hard surface during assembly into a device, such as a mobile telephone or wireless earbuds. Those sudden, large changes in air pressure can cause a substantial deformation of the diaphragm, resulting in damage to the diaphragm.

For some types of microelectromechanical microphones, overpressure valves in the diaphragm can be used to relieve some of the air pressure to which the microelectromechanical is subjected. An overpressure valve can open during high-pressure load and, by relieving pressure, damage to the diaphragm can be avoided.

Unfortunately, overpressure valves can be detrimental to low frequency roll-off (LFRO) of a microelectromechanical microphone. In addition, overpressure valves can have rather slow opening times that may render them inadequate for abrupt, large changes in air pressure. Therefore, improved technologies for the reduction of damage to diaphragms in microelectromechanical microphones may be desired.

SUMMARY

The following presents a simplified summary of one or more of the embodiments in order to provide a basic understanding of one or more of the embodiments. This summary is not an extensive overview of the embodiments described herein. It is intended to neither identify key or critical elements of the embodiments nor delineate any scope of embodiments or the claims. The sole purpose of this Summary is to present some concepts of the embodiments in a simplified form as a prelude to the more detailed description that is presented later.

In an embodiment, the disclosure provides a microelectromechanical microphone device. The microelectromechanical microphone device includes a rigid plate defining multiple openings that permit passage of a pressure wave. The microelectromechanical microphone device also includes a stiffener member integrated into the rigid plate, wherein the stiffener member causes stress to be distributed within the rigid plate in response to the pressure wave inducing deformation of the rigid plate.

In another embodiment, the disclosure provides a method. The method includes forming a rigid plate defining multiple openings that permit passage of a pressure wave. The method also includes integrating a stiffener member into the rigid plate. The stiffener member causes stress to be distributed within the rigid plate in response to the pressure wave inducing deformation of the rigid plate.

In yet another embodiment, the disclosure provides a device. The device includes a microelectromechanical microphone device including a rigid plate mechanically defining multiple openings that permit passage of a pressure wave; and a stiffener member integrated into the rigid plate. The stiffener member causes stress to be distributed within the rigid plate in response to the pressure wave inducing deformation of the rigid plate. The device also includes a circuit coupled to the microelectromechanical microphone device and configured to receive a first signal indicative of a capacitance representative of an amplitude of the pressure wave. The circuit is further configured to generate a second signal representative of an amplitude of the pressure wave.

Other embodiments and various examples, scenarios and implementations are described in more detail below. The following description and the drawings set forth certain illustrative embodiments of the specification. These embodiments are indicative, however, of but a few of the various ways in which the principles of the specification may be employed. Other advantages and novel elements of the embodiments described will become apparent from the following detailed description of the specification when considered in conjunction with the drawings.

DETAILED DESCRIPTION

Embodiments of this disclosure address the issue of breakage of elements of microelectromechanical microphones when subjected to an abrupt, large change in air pressure. A microelectromechanical microphone can be subjected to substantial changes in air pressure during assembly of the microelectromechanical microphone into a device (such as a mobile telephone or a tablet computer) or during usage of the device, after assembly. In some situations, the microelectromechanical microphone can fall onto a hard surface in an assembly line. In other situations, the device containing the microelectromechanical microphone can fall. Substantial changes in air pressure can deflect a diaphragm of the microelectromechanical microphone by several or even tens of microns. Those changes can result in the diaphragm deforming a backplate of the microelectromechanical microphone, with the ensuing substantial stress in a vicinity of a suspension interface between the backplate and a support member within the microelectromechanical microphone. That stress can be particularly elevated in large microelectromechanical microphones with high signal-to-noise (SNR) ratio and fully suspended diaphragms. High stress may lead to the breakage of the backplate, with the ensuing failure of the microelectromechanical microphone.

Embodiments of this disclosure provide microelectromechanical microphones having a stiffener member integrated into a backplate in the microelectromechanical microphones. The stiffener member can improve robustness of the backplate with respect to a pressure wave including a threshold amplitude. The threshold amplitude represents a threshold pressure (e.g., 6 bar, 7 bar, or 8 bar). The stiffener member improves the robustness of the backplate by distributing stress within the backplate in response to a deformation induced by such a pressure wave. The integration of the stiffener member can be accomplished in numerous ways. In some cases, the stiffener member is formed on a surface of the backplate, forming a substantially planar interface with a portion of the backplate. In other cases, the stiffener member can be formed within the backplate, during formation of the backplate. In those cases, the stiffener member can be buried within the backplate.

Regardless of the type of integration, the stiffener member can be formed from a material that has a Young's modulus that is greater than the Young's modulus of a material that constitutes the backplate. Simply as an illustration, the stiffener member can be formed from a metal, an alloy of two or more metal, or a dielectric material (including nitrides and oxides). Further, the stiffener member can extend by a particular distance over a suspension member that mechanically couples the backplate to a suspension member. Accordingly, by overhanging relative to the suspension member and by being stiffer than the backplate, the stiffener member can reduce the deformation of the backplate about a suspension interface with the suspension member. In other words, the stiffener member can reduce the magnitudes of displacement vectors in a deformation field of the rigid plate. Such a reduction can be present in a region commensurate with the distance that the stiffener member overhangs relative to the suspension member.

In some embodiments, the stiffener member can have an axially-symmetric geometry relative to an axis perpendicular to the backplate of the microelectromechanical microphone. In other embodiments, the stiffener member can have a centrosymmetric geometry relative to a geometric center of the backplate. Regardless of its geometry, the stiffener member can be embodied in an extended structure, such as an annular structure, and can have a uniform thickness and a substantially uniform width. In some embodiments, the thickness can have a magnitude within a range from about 1 µm to about 10 µm. In addition, or in other embodiments, the width can have a magnitude within a range from about 5 µm to about 20 µm.

In contrast to conventional technologies, the incorporation of a stiffener member in a microelectromechanical microphone can provide fast response times to an intense pressure pulse, or train of pressure pulses, deforming the backplate of the microelectromechanical microphone. Because the stiffener member is spatially extended and increases stiffness of the backplate, stress present in the backplate can be distributed within a region about a suspension section of the backplate as the backplate deforms in response to a pressure pulse. Further, the incorporation of a stiffener member into a microelectromechanical microphone is not detrimental to the performance of the microelectromechanical microphone responsive to acoustic waves having amplitudes corresponding to normal sound pressure intensities.

Figure 1:
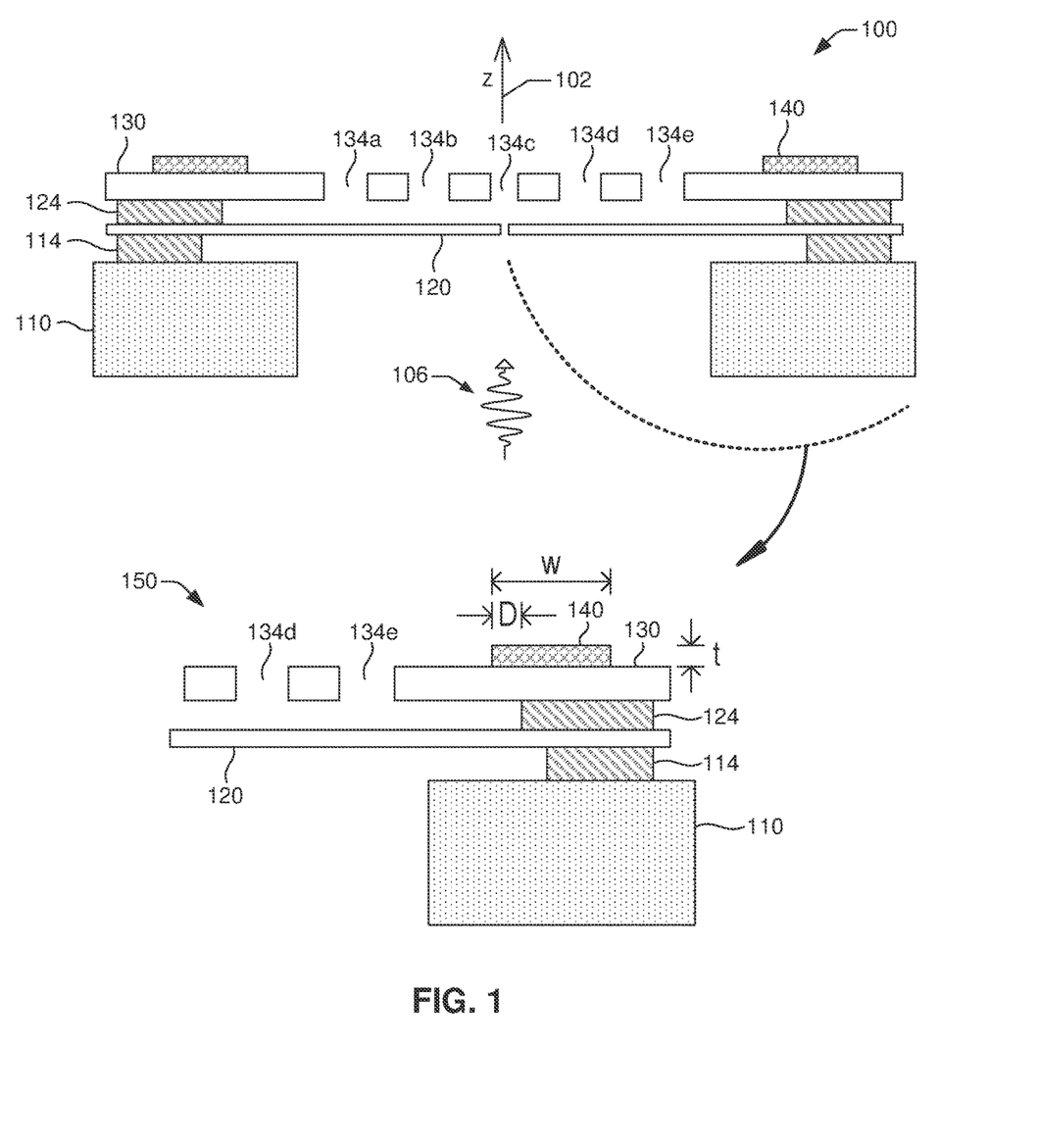
FIG. 1 illustrates a cross-sectional view of an example of a microelectromechanical microphone die, in accordance with one or more embodiments of the disclosure.

With reference to the drawings, FIG. 1 illustrates various cross-sectional views of an example of a microelectromechanical microphone die 100 in accordance with one or more embodiments of the disclosure. The microelectromechanical microphone die 100 can constitute a microelectromechanical microphone device. The microelectromechanical microphone die 100 includes a substrate 110 that defines an opening to receive a pressure wave 106. The pressure wave 106 has amplitudes and phases indicating, collectively, pressures that can be greater than or less than atmospheric pressure. In some embodiments, rather than being relative to atmospheric pressure, those pressures can be relative to a reference pressure of the environment of the microelectromechanical microphone die 100. In some cases, the pressure wave 106 can correspond to an acoustic wave. Thus, the pressure wave 106 can have a waveform representative of an audio signal, such as an audible signal or an ultrasonic signal, or both. The audible signal can represent natural speech, an utterance, or environmental noise, for example. In other cases, the pressure wave 106 can have a waveform defining a single pulse or a train of pulses of large amplitude.

In some embodiments, the opening defined by the substrate 110 can be axially symmetric about an axis 102 (denoted as z, for the sake of nomenclature). For instance, the opening can have a circular perimeter. In other embodiments, the opening can be centrosymmetric relative to a geometric center of the opening. For instance, the opening can have a square perimeter, a hexagonal perimeter, or an octagonal perimeter.

The substrate 110 can be formed from, or can include, a semiconducting material or an electrically insulating material (silicon dioxide, aluminum oxide (such as sapphire), or aluminum nitride, for example). In some embodiments, the semiconducting material can include silicon (amorphous, polycrystalline or crystalline); germanium; a semiconductor compound formed from an element in group III and another element in group V (referred to as a III-V semiconductor); a semiconductor compound formed from an element in group II and an element in group VI (referred to as a II-VI semiconductor); or a combination of two or more of the foregoing materials. Such a combination can be embodied in an alloy or a composite. In one example, the substrate 110 can be embodied in a silicon substrate. In another example, the substrate 110 can be embodied in a GaAs substrate. In yet another example, the substrate 110 can be embodied in a sapphire substrate. In still another example, the substrate 110 can be embodied in ZnS substrate.

The microelectromechanical microphone die 100 also includes a flexible plate 120 that is mechanically coupled to the substrate 110. A suspension member 114 mechanically couples the flexible plate 120 to the substrate 110. The suspension member 114 can be referred to as a "bottom spacer" and extends between the substrate 110 and the flexible plate 120. The suspension member 114 can be formed from a dielectric material, and also can be referred to as dielectric member 114.

The flexible plate 120 can embody, or can constitute, a diaphragm of a microelectromechanical microphone that includes the microelectromechanical microphone die 100. In some embodiments, the flexible plate 120 can be formed from a semiconductor or an electrically conducting material (such as a doped semiconductor or a metal). For example, the flexible plate 120 can be formed from silicon (amorphous, polycrystalline or crystalline); germanium; a III-V semiconductor; a II-VI semiconductor; or a combination (such as an alloy) of two or more of the foregoing materials. As another example, the flexible plate 120 can be formed from gold, silver, platinum, titanium, other types of noble metals, aluminum, copper, tungsten, chromium, or an alloy of two or more of the foregoing metals. In other embodiments, the flexible plate 120 can be formed from a composite material containing a dielectric (e.g., silicon dioxide, aluminum oxide, silicon nitride, or similar) and a semiconductor as is disclosed herein. In yet other embodiments, the flexible plate 120 can be formed entirely from a dielectric material.

The electromechanical microphone die 100 also includes a rigid plate 130 that is mechanically coupled to the flexible plate 120. A suspension member 124 mechanically couples the rigid plate 130 to the flexible plate 120. The suspension member 124 can be referred to as an "airgap spacer" and extends between the rigid plate 130 and the flexible plate 120. The suspension member 124 can be formed from a dielectric material, and also can be referred to as dielectric member 124.

The rigid plate 130 can define multiple openings that can permit passage of air that transports the pressure wave 106. More generally, such openings can permit passage of a fluid that transports the pressure wave 106. As is illustrated in FIG. 1, the openings include a first opening 134a, a second opening 134b, a third opening 134c, a fourth opening 134d, and a fifth opening 134e.

The rigid plate 130 can embody, or can constitute, a backplate of the microelectromechanical microphone that includes the microelectromechanical microphone die 100. In some embodiments, the rigid plate 130 can be formed from a semiconductor or an electrically conducting material (e.g., a doped semiconductor or a metal). For example, the rigid plate 130 can be formed from silicon (amorphous, polycrystalline or crystalline); germanium; a semiconductor compound from group III; a III-V semiconductor; a II-VI semiconductor; or a combination (such as an alloy) of two or more of the foregoing. As another example, the rigid plate 130 can be formed from gold, silver, platinum, titanium, other types of noble metals, aluminum, copper, tungsten, chromium, or an alloy of two or more of the foregoing metals. In other embodiments, the rigid plate 130 can be formed from a composite material containing a dielectric (e.g., silicon dioxide, aluminum oxide, silicon nitride, or similar) and a semiconductor as is disclosed herein. In yet other embodiments, the movable plate 110 can be formed entirely from a dielectric.

The suspension member 124 can be formed from an electrically insulating material, e.g., amorphous silicon, silicon dioxide, aluminum oxide, silicon nitride, or similar insulators. In some embodiments, as is depicted in FIG. 1, the suspension member 114 and the suspension member 124 can be formed from the same electrically insulating material, e.g., amorphous silicon, silicon dioxide, silicon nitride, or the like. In other embodiments, a particular combination of different materials can be utilized.

In some embodiments, the rigid plate 130 and the flexible plate 120 can be formed from the same electrically conducting material, e.g., a doped semiconductor or a metal. More generally, the rigid plate 130 can be formed from the same or similar material(s) as the flexible plate 120. For example, the rigid plate 130 can be formed from amorphous silicon, polycrystalline silicon, crystalline silicon, germanium, an alloy of silicon and germanium, a III-V semiconductor, a II-VI semiconductor, a dielectric (e.g., silicon dioxide, aluminum oxide, silicon nitride, aluminum nitride, and so forth), or a combination (such as an alloy or a composite) of two or more of the foregoing materials.

The flexible plate 120 can be configured to be deformed by the pressure wave 106. Specifically, the flexible plate 120 can include a suspended section that covers the opening defined by the substrate 110. In some embodiments, the suspended section also can be axially symmetric about the axis 102. For example, the suspended section also can have a circular perimeter. The suspension member 114 and the suspension member 124 can serve as suspension supports about which the suspended section of the flexible plate 120 can bend in response to the pressure wave 106. As is illustrated in FIG. 1, in some embodiments, the flexible plate 120 can define an opening at, or near, the geometric center of the suspended section.

The microelectromechanical microphone die 100 also includes a stiffener member 140 that can be integrated into the rigid plate 120. In some embodiments, such an integration can be accomplished by depositing a material onto a portion of the rigid plate 130, where the deposited material forms the stiffener member 140. The material can be deposited using one of various deposition processes, such as physical vapor deposition (PVD) or chemical vapor deposition (CVD). In one example, the material can be formed using metal organic chemical vapor deposition (MOCVD). In other embodiments, the stiffener member 140 can be integrated into the rigid plate by fusing a side of the stiffener member to a surface of the rigid plate by means of a glue or another type of adhesive.

The stiffener member 140 can be formed from a material that is different from the material that constitutes the rigid plate 120. More specifically, those materials can have different mechanical properties. For instance, a Young's modulus of the material that constitutes the stiffener member 140 can be greater than a Young's modulus of the material that constitutes the rigid plate 130. In some embodiments, the material that constitutes the stiffener member 140 can be embodied in an electrically insulating material, such as silicon dioxide, aluminum oxide, silicon nitride, aluminum nitride, or a similar insulator. In other embodiments, the stiffener member 140 can be formed from an electrically conducting material, such as a metal or an alloy including a metal (e.g., a binary alloy including a metal, a ternary alloy including the metal, or a quaternary alloy including the metal). In one example, the stiffener member 140 can be formed from Al. In another example, the stiffener member 140 can be formed from AlCu alloy. In yet another example, the stiffener member 140 can be formed from an AlCuMgMn alloy.

Diagram 150 in FIG. 1 illustrates a detail of a section of the microelectromechanical microphone die 100. As is shown in diagram 150, the stiffener member 140 overlays a portion of the rigid plate 130, forming a substantially planar interface with the portion of the rigid plate 130. The stiffener member 140 can have a uniform thickness t (a real number in units of length) and a width w (a real number in units of length). In some embodiments, the stiffener member 140 has an annular geometry having axial symmetry relative to the axis 102, where w can have a magnitude in a range from about 5 µm to about 20 µm. In some cases, t can have a magnitude within a range from about 1 µm to about 10 µm. Such a magnitude can depend upon a Young's modulus of the material that constitutes the stiffener member 140. A greater Young's modulus can result in smaller magnitude of t. In some cases, a ratio between t and the thickness of the suspension 124 can range from approximately 0.3 to approximately 0.5.

The stiffener member 140 can be placed to extend by a distance D (a real number in units of length) over the suspension member 124, toward the geometric center of the flexible plate 120. Thus, D is the distance between an edge of the stiffener member 140 and an edge of the suspension member 124. The distance D can have a magnitude in a range from about 2 µm to about 6 µm. For a particular thickness t and combination of respective materials of the stiffener member 140 and the rigid plate 130, a lower bound of the magnitude of D can be determined at least by a fracture threshold of the rigid plate 130 at the suspension interface defined by the intersection between the rigid plate 130 and the suspension member 124. In other words, a stiffener member 140 of a particular thickness must overhang relative to the suspension member 124 by a distance that is at least sufficient to reduce stress at the suspension interface below the fracture threshold.

Figure 2:
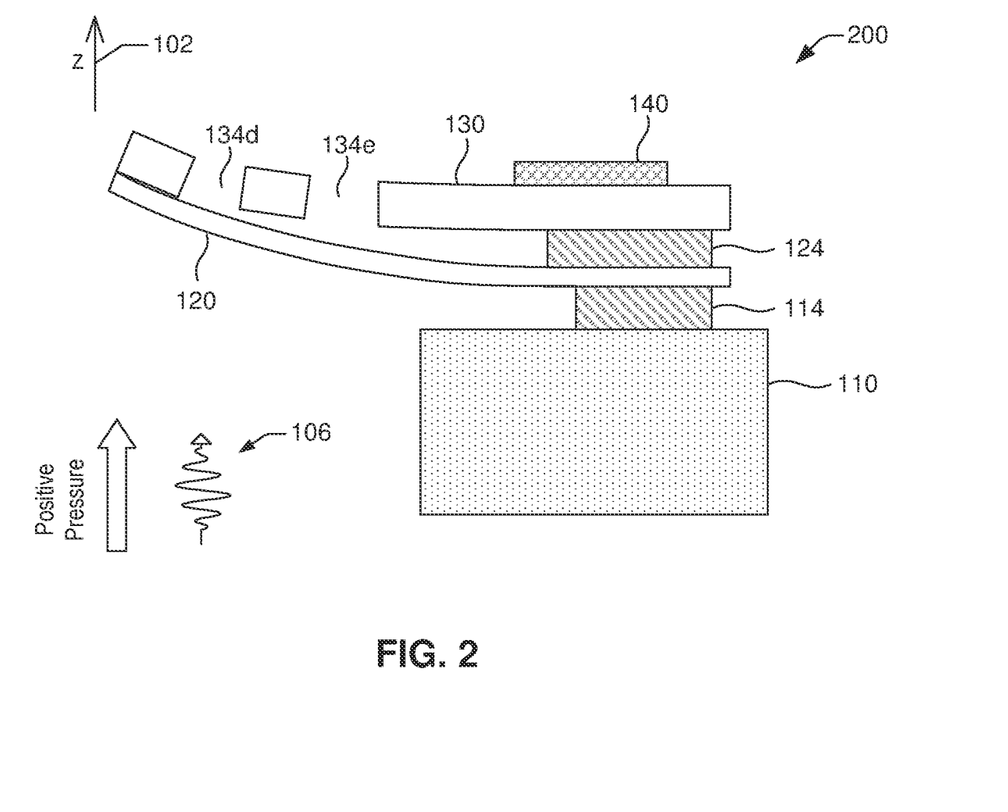
FIG. 2 illustrates an example of a scenario in which the microelectromechanical microphone die illustrated in FIG. 1 is subjected to high pressure.

FIG. 2 illustrates an example of a scenario in which the microelectromechanical microphone die 100 (FIG. 1) can be subjected to high pressure. In some cases, the pressure wave 106 includes amplitudes and respective phases that collectively represent positive pressures—e.g., pressures that are greater than atmospheric pressure or a pressure of an environment of the microelectromechanical microphone die 100 operates. Accordingly, a threshold amplitude in the pressure wave 106 can represent a threshold pressure. In some cases, the threshold pressure can be in a range from about 6 bar to 10 bar. For example, the threshold pressure can about 7 bar. Under positive pressure $P^{(+)}$, the flexible plate 120 can be deflected towards the rigid plate 130, in a positive direction along the axis 102. When the magnitude of $P^{(+)}$ is equal to or greater than the threshold pressure, the flexible plate 120 can deform the rigid plate 130. In response to such a deformation, the stiffener member 140 causes stress to be distributed within the rigid plate 120. By distributing the stress, the stiffener member 140 can permit avoiding damage to the rigid plate 120.

Figure 3:
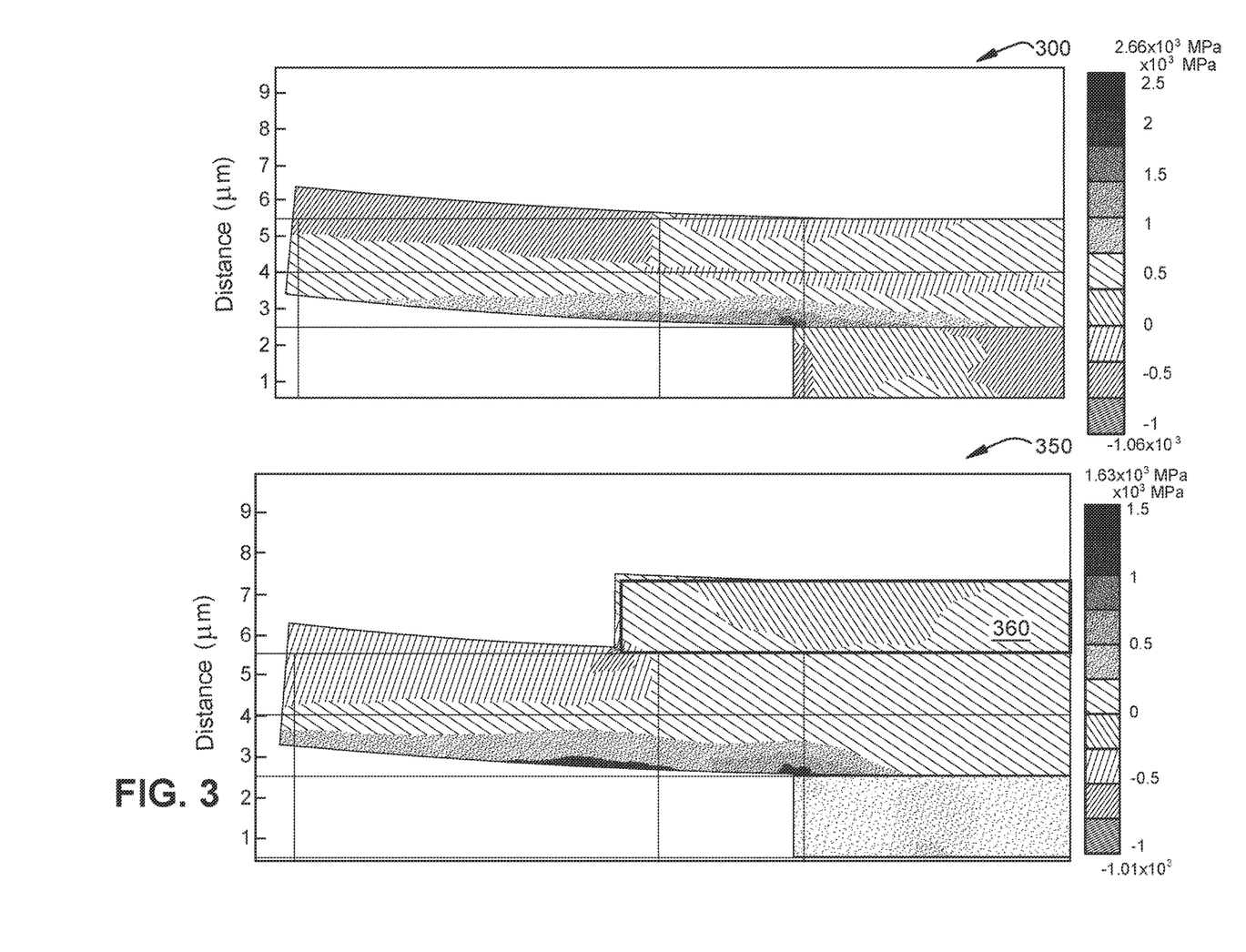
FIG. 3 includes topographic maps of first principal stress in respective examples of microelectromechanical microphone dies, in accordance with one or more embodiments of this disclosure.

To illustrate the distribution of stress caused by a stiffener member of this disclosure, FIG. 3 includes topographic maps of first principal stress in respective examples of microelectromechanical microphone dies, in accordance with one or more embodiments of this disclosure. The first principal stress is determined using a finite elements method (FEM) simulation with $P^{(+)}=7$ bar applied along the ordinate in FIG. 3. Topographic map 300 illustrates first principal stress (in MPa) for a microelectromechanical microphone die that lacks a stiffener member. Topographic map 350 illustrates first principal stress (in MPa) for a microelectromechanical microphone die that includes a stiffener member. In FIG. 3, the stiffener member is represented by block 360, placed in a position corresponding to absence of deformation. As it is shown in topographic map 350, compared to the microelectromechanical microphone die without a stiffener member, integration of the stiffener member causes stress to be distributed within the backplate of the microelectromechanical microphone die. Integration of the stiffener member can cause a magnitude of stress at a vicinity of a suspension interface between the backplate and the suspension member to be reduced by about 30% to about 50% relative to the magnitude of the stress in the absence of the stiffener member.

A stiffener member in accordance with aspects of this disclosure need not be affixed to a surface of a backplate of a microelectromechanical microphone in order to distribute stress within the rigid plate in response to a pressure wave 106 including amplitude(s) exceeding a threshold amplitude. The stiffener member also can be buried within the backplate of the microelectromechanical microphone in order to distribute stress within the rigid plate in response to the pressure wave 106 including amplitude(s) exceeding the threshold amplitude.

Figure 4:
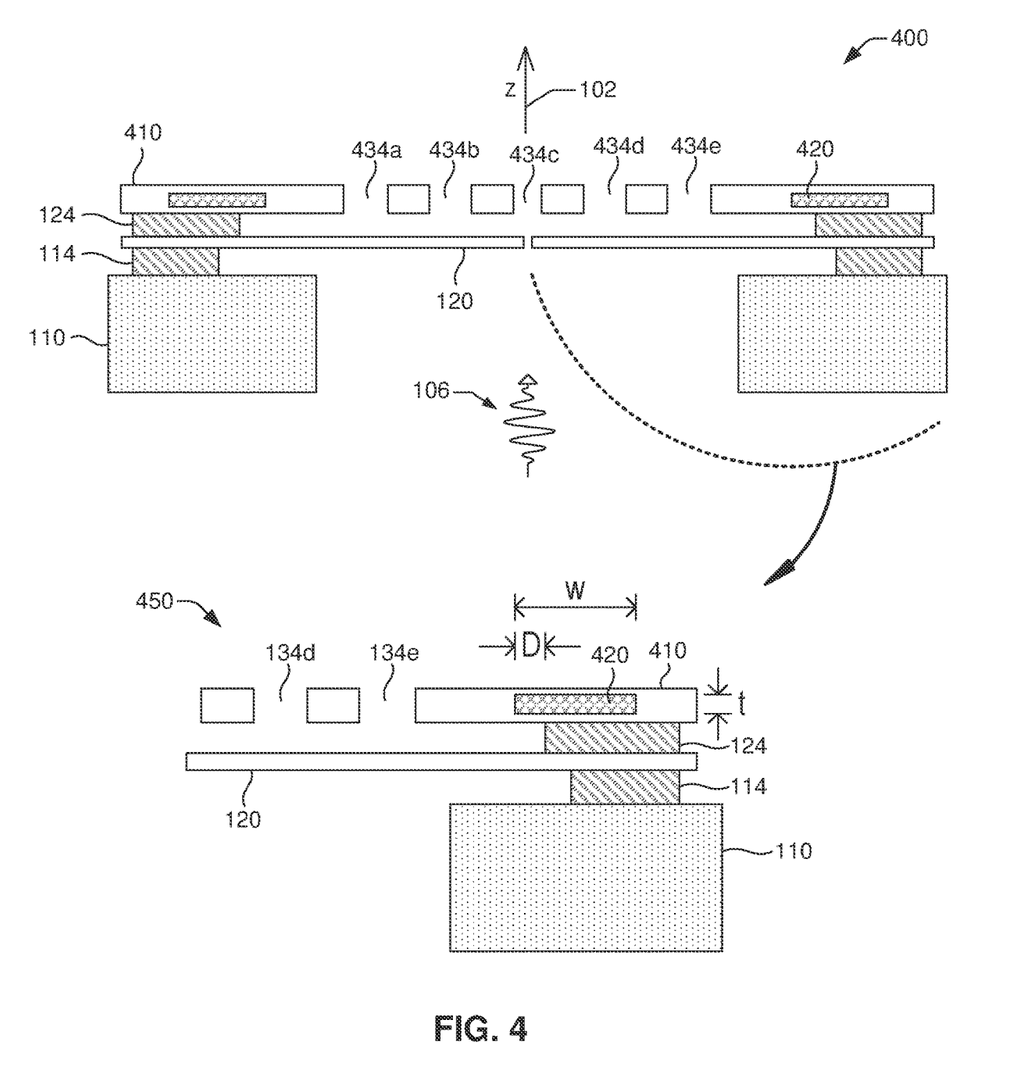
FIG. 4 illustrates cross-sectional views of an example of a microelectromechanical microphone die, in accordance with one or more embodiments of the disclosure.

FIG. 4 illustrates various cross-sectional views of an example of a microelectromechanical microphone die 400 having a stiffener member 420 integrated into a rigid plate 410, in accordance with one or more embodiments of the disclosure. The microelectromechanical microphone die 300 can constitute a microelectromechanical microphone device. The rigid plate 410 can embody, or can constitute, a backplate of a microelectromechanical microphone that includes the microelectromechanical microphone die 300. The microelectromechanical microphone die 300 includes the substrate 110 defining an opening to receive pressure waves 106. As mentioned, in some embodiments, the opening can be axially symmetric about the axis 102. For instance, the opening can have a circular perimeter. Again, the substrate 110 can be formed from a semiconducting material or an electrically insulating material (sapphire or silicon dioxide, for example).

The electromechanical microphone die 300 also includes the flexible plate 120 that is mechanically coupled to the substrate 110. As mentioned, the suspension member 114 mechanically couples the flexible plate 120 to the substrate 110. As is illustrated in FIG. 4, the suspension member 114 extends between the substrate 110 and the flexible plate 120.

As noted, the electromechanical microphone die 300 includes the rigid plate 410 mechanically coupled to the flexible plate 120. The suspension member 124 mechanically couples the rigid plate 410 to the flexible plate 120. The suspension member 124 extends between the rigid plate 410 and the flexible plate 120.

The rigid plate 410 defines multiple openings that can permit passage of air that transports the pressure wave 106. As mentioned, more generally, such openings can permit passage of a fluid that transports the pressure wave 106. As is illustrated in FIG. 4, the openings include a first opening 414*a*, a second opening 314*b*, a third opening 414*c*, a fourth opening 414*d*, and a fifth opening 414*e*.

In some embodiments, the rigid plate 410 can be formed from a semiconductor or an electrically conducting material (e.g., a doped semiconductor or a metal). For example, the rigid plate 410 can be formed from silicon (amorphous, polycrystalline or crystalline); germanium; a semiconductor compound from group III; a III-V semiconductor; a II-VI semiconductor; or a combination (such as an alloy) of two or more of the foregoing. As another example, the rigid plate 310 can be formed from gold, silver, platinum, titanium, other types of noble metals, aluminum, copper, tungsten, chromium, or an alloy of two or more of the foregoing metals. In other embodiments, the rigid plate 410 can be formed from a composite material containing a dielectric (e.g., silicon dioxide, aluminum oxide, silicon nitride, or similar) and a semiconductor as is disclosed herein. In yet other embodiments, the plate 10 can be formed entirely from a dielectric.

In some embodiments, the rigid plate 410 and the flexible plate 120 can be formed from the same electrically conducting material, e.g., a doped semiconductor or a metal. More generally, the rigid plate 310 can be formed from the same or similar material(s) as the flexible plate 320. For example, the rigid plate 410 can be formed from amorphous silicon, polycrystalline silicon, crystalline silicon, germanium, an alloy of silicon and germanium, a III-V semiconductor, a II-VI semiconductor, a dielectric (silicon dioxide, silicon nitride, aluminum oxide, aluminum nitride, and so forth), or a combination (such as an alloy or a composite) of two or more of the foregoing materials.

As mentioned, the microelectromechanical microphone die 300 also includes the stiffener member 420 integrated into the rigid plate 410. Such an integration can be accomplished by forming the stiffener member 420 during formation of the rigid plate 410. To that end, a material can be deposited onto a first section of the rigid plate 410 during the formation of the rigid plate 410. The material can be deposited using one of various deposition processes, such as PVD or CVD and its variants. The deposited material forms the stiffener member 420. The formation of the rigid plate can further include the formation of a second section of the rigid plate, where the second section covers the stiffener member 420. As a result, the stiffener member 420 is buried within the rigid plate 410. A layer of the rigid plate 410 that overlays the stiffener member 420 can have a uniform thickness in a range from about 1 µm to about 2 µm. In one example, a magnitude of such a thickness can be equal to about 1.5 µm.

The stiffener member 420 can be formed from a material that is different from the material that constitutes the rigid plate 410. More specifically, those materials can have different mechanical properties. For instance, a Young's modulus of the material that constitutes the stiffener member 420 can be greater than a Young's modulus of the material that constitutes the rigid plate 130. In some embodiments, the material that constitutes the stiffener member 410 can be embodied in an electrically insulating material. In some cases, the electrically insulating material can include one of silicon nitride, aluminum nitride, an alkali halide, lithium fluoride, barium titanate, or lead titanate, or similar dielectric material. In other cases, the electrically insulating material can include one of one of alumina, silicon monoxide, silicon dioxide, titanium dioxide, hafnium dioxide, tantalum oxide, tungsten oxide, zirconium dioxide, or similar oxide.

Accordingly, the rigid plate 410 and the stiffener member 420 can be formed in multiple combinations of materials. For example, the rigid plate 410 can be formed from polycrystalline silicon and the stiffener member 420 can be formed from an oxide of silicon, such silicon dioxide. As another example, the rigid plate 410 can be formed from polycrystalline silicon and the stiffener member 420 can be formed from a semiconductor material, such as polycrystalline silicon (doped or undoped) or a SiGe compound.

Diagram 450 in FIG. 4 illustrates a detail of a section of the microelectromechanical microphone die 400. As mentioned, the stiffener member 420 is buried within the rigid plate 410, forming an interface with a portion of the rigid plate 410. The stiffener member 420 can have a uniform thickness t (a real number in units of length) and a width w (a real number in units of length). In some embodiments, the stiffener member 140 has an annular geometry having axial symmetry relative to the axis 102, where w can have a magnitude in a range from about 5 µm to about 20 µm. In some cases, t can have a magnitude within a range from about 1 µm to about 10 µm. Such a magnitude can depend upon a Young's modulus of the material that constitutes the stiffener member 420. A greater Young's modulus can result in smaller magnitude of t. In some cases, a ratio between t and the thickness of the suspension 124 can range from approximately 0.3 to approximately 0.5.

The stiffener member 420 can be placed to extend by a distance D (a real number in units of length) over the suspension member 124, toward the geometric center of the flexible plate 120. Thus, D is the distance between an edge of the stiffener member 410 and an edge of the suspension member 124. The distance D can have a magnitude in a range from about 2 µm to about 6 µm. For a particular thickness t and combination of respective materials of the stiffener member 420 and the rigid plate 410, a lower bound of the magnitude of D can be determined at least by a fracture threshold of the rigid plate 410 at the suspension interface defined by the intersection between the rigid plate 410 and the suspension member 124. In other words, a stiffener member 420 of a particular thickness overhangs relative to the suspension member 124 by a distance that is at least sufficient to reduce stress at the suspension interface below the fracture threshold.

Figure 5:
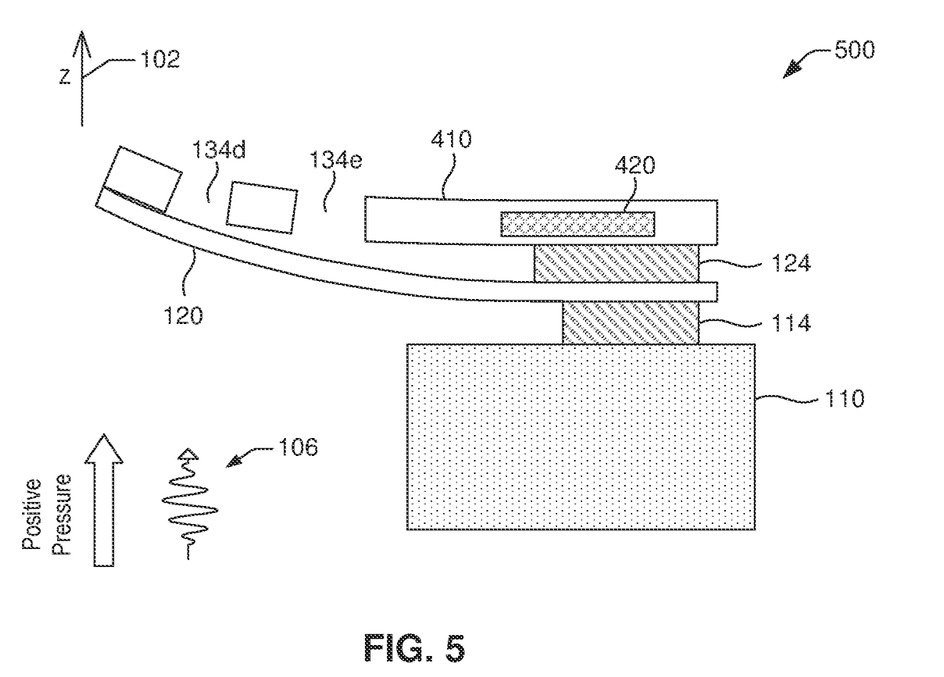
FIG. 5 illustrates an example of a scenario in which the microelectromechanical microphone die illustrated in FIG. 4 is subjected to high pressures.

FIG. 5 illustrates an example of a scenario in which the microelectromechanical microphone 400 (FIG. 4) can be subjected to high pressure. As mentioned, in some cases, the pressure wave 106 includes amplitudes and respective phases that collectively represent positive pressure. Again, under positive pressure $P^{(+)}$, the flexible plate 120 can be deflected towards the rigid plate 410, in a positive direction along the axis 102. When the magnitude of $P^{(+)}$ is equal to or greater than a threshold pressure, the flexible plate 120 can deform the rigid plate 410. The threshold pressure can be in a range from about 6 bar to about 10 bar (e.g., 6 bar, 7 bar, 8 bar, 9 bar, or 10 bar). In response to such a deformation, the stiffener member 420 causes stress to be distributed within the rigid plate 120. By distributing the stress, the stiffener member 420 can permit avoiding damage to the rigid plate 410.

Figure 6:
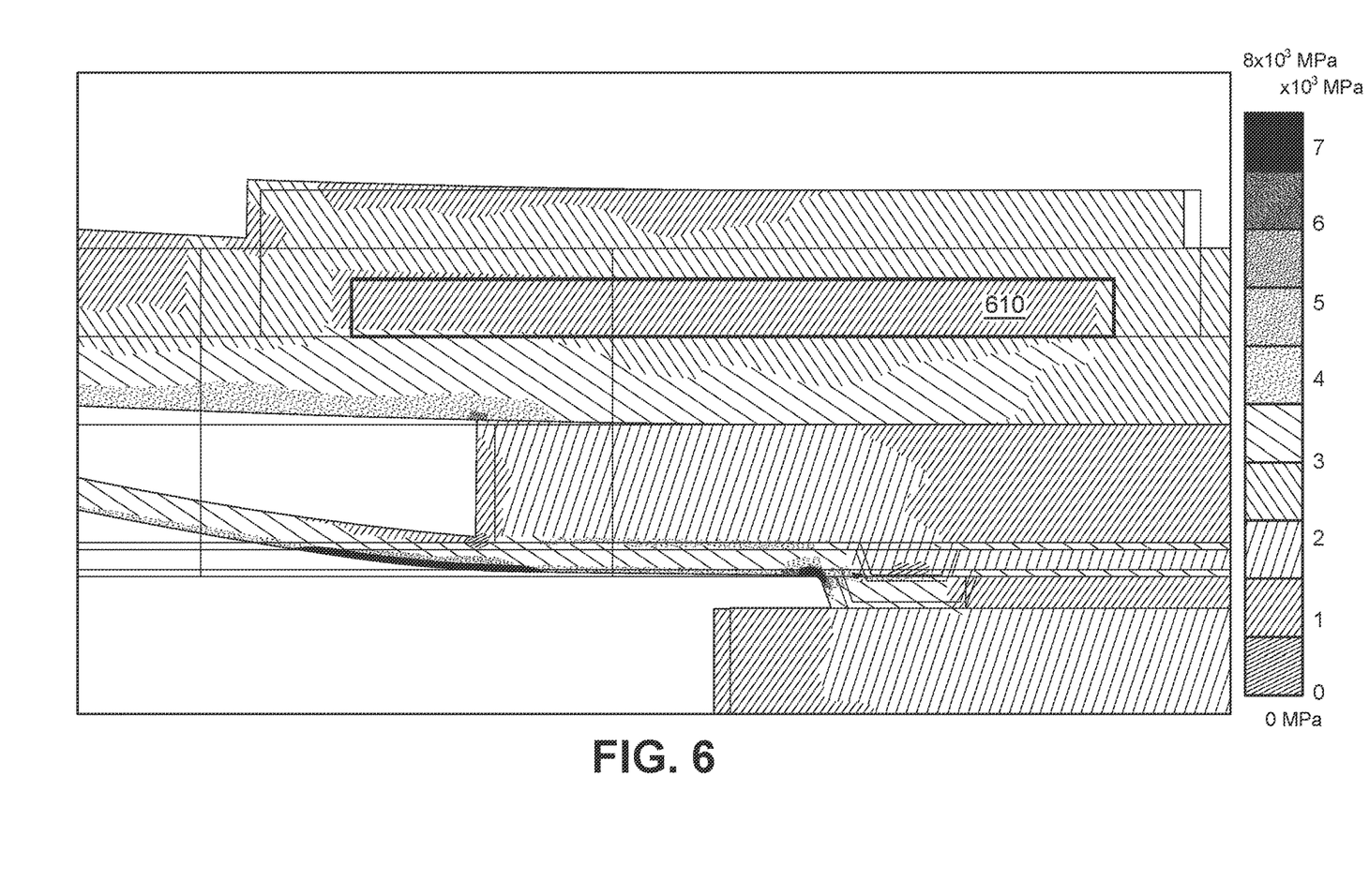
FIG. 6 is a topographic map of first principal stress in an example of microelectromechanical microphone die, in accordance with one or more embodiments of this disclosure.

To illustrate the distribution of stress caused by a stiffener member of this disclosure, FIG. 6 is a topographic map 600 of first principal stress in an example of a microelectromechanical microphone die, in accordance with one or more embodiments of this disclosure. The first principal stress is determined using a FEM simulation with $P^{(+)}$=8 bar applied along the ordinate in FIG. 6. Topographic map 600 illustrates first principal stress (in MPa) for a microelectromechanical microphone die that includes a stiffener member buried within a backplate of the microelectromechanical microphone die. In FIG. 6, the stiffener member is represented by block 610, placed in a position corresponding to absence of deformation. As is shown in the topographic map 600, stress is distributed across a region in the backplate and a region of the diaphragm of the microelectromechanical microphone die. Relative to a microelectromechanical microphone die without the stiffener member, integration of the stiffener member into the backplate results in a reduction of about 36% near region P3, and a reduction of about 47% near region P2.

Figure 7:
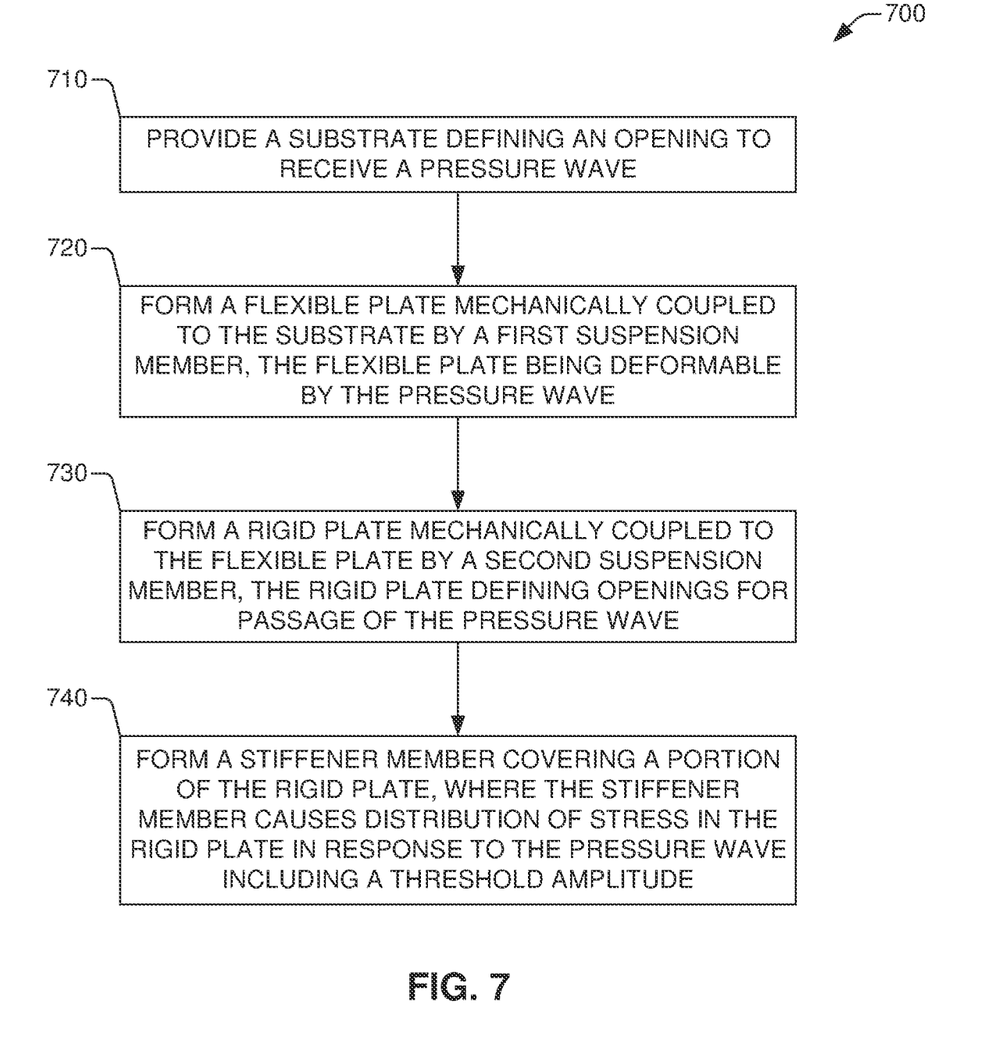
FIG. 7 illustrates an example of a method for providing a microelectromechanical microphone having a robust backplate, in accordance with one or more embodiments of this disclosure.

FIG. 7 illustrates an example of a method 700 for providing a microelectromechanical microphone having a robust backplate, in accordance with one or more embodiments of this disclosure. At block 710, a substrate defining an opening to receive a pressure a pressure can be provided. In some embodiments, the opening can have an axially-symmetric perimeter about an axis that is perpendicular to a planar surface of the substrate and pierces the planar surface at its geometric center. In other embodiments, the opening can have a perimeter that is centrosymmetric relative to that geometric center. In one example, the substrate can be embodied in the substrate 110 (FIG. 1) and the pressure wave can be embodied in the pressure wave 106 (FIG. 1).

At block 720, a flexible plate mechanically coupled to the substrate can be formed. The flexible plate can be deformed by the pressure wave. The flexible plate can embody a diaphragm in the microelectromechanical microphone. The flexible plate can be formed from a semiconductor or an electrically conducting material. The flexible plate can be mechanically coupled to the substrate by a suspension member. The suspension member can be formed from a dielectric material. Continuing with the example mentioned in connection with block 810, the flexible plate can be embodied in the flexible plate 120 (FIG. 1) and the suspension member can be embodied in the dielectric member 114 (FIG. 1).

At block 730, a rigid plate mechanically coupled to the flexible plate can be formed. The rigid plate defines multiple openings that permit passage of a fluid that transports the pressure wave. The rigid plate can be formed from a semiconductor or an electrically conducting material. The rigid plate can embody a backplate in the microelectromechanical microphone. The rigid plate can be mechanically coupled to the flexible plate by a second suspension member. The second suspension member can be formed from a dielectric material. Further to example mentioned in connection with block 710 and block 720, the rigid plate can embody the rigid plate 130 (FIG. 1). In another example, the rigid plate can embody the rigid plate 410 (FIG. 4).

At block 740, a stiffener member covering a portion of the rigid plate can be formed. The stiffener member can be embodied in the stiffener member 140 (FIG. 1), for example. The stiffener member can be formed from a dielectric material, a metal, or an alloy of two or several metals. In one example, the stiffener member can be formed from an AlCu alloy. The stiffener member causes distribution of stress in the rigid plate in response to the pressure wave including a threshold amplitude.

Figure 8:
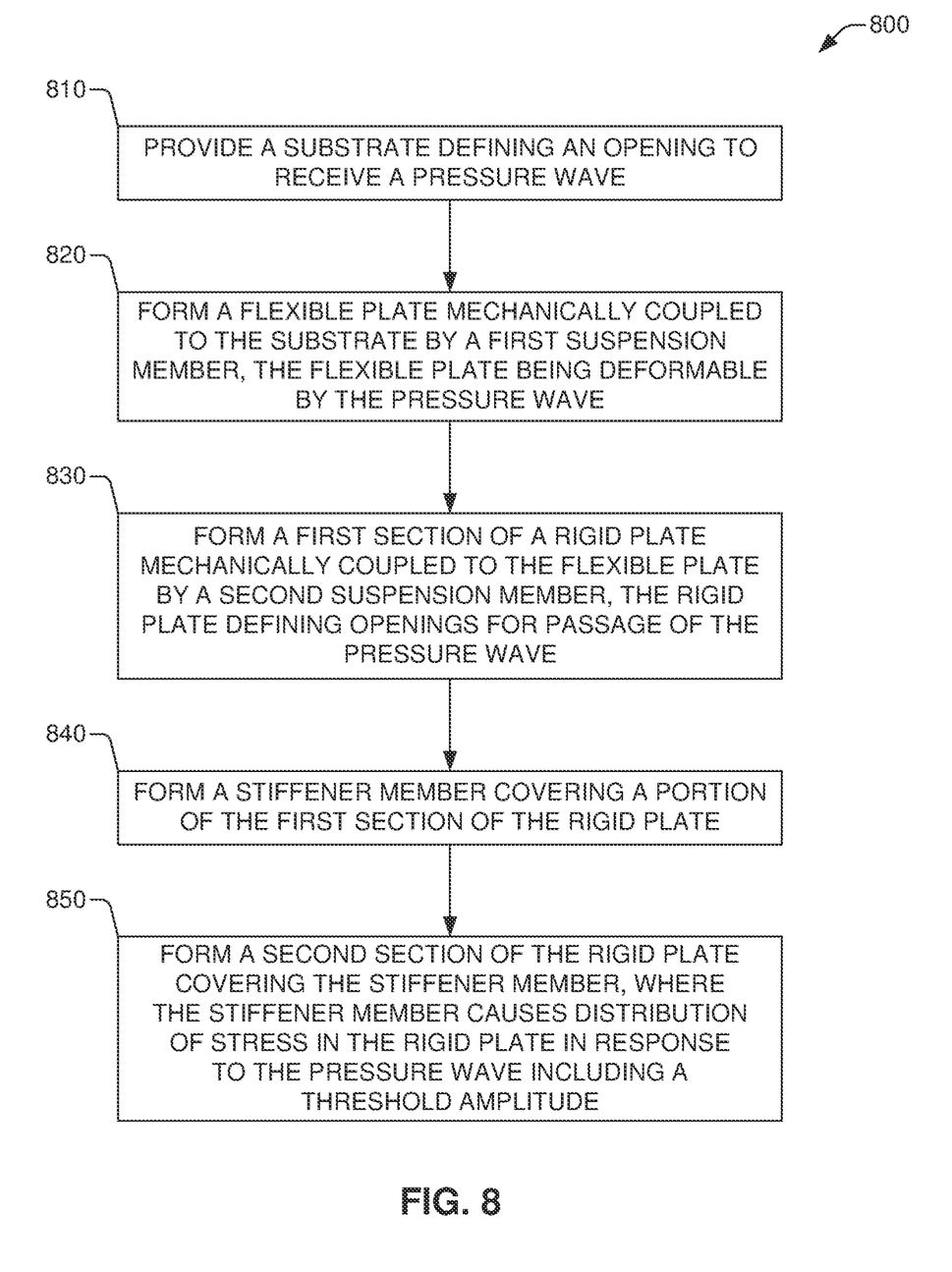
FIG. 8 illustrates an example of a method for providing a microelectromechanical microphone having a robust backplate, in accordance with one or more embodiments of this disclosure.

FIG. 8 illustrates an example of a method 800 for providing a microelectromechanical microphone having a robust backplate, in accordance with one or more embodiments of this disclosure. At block 810, a substrate defining an opening to receive a pressure a pressure can be provided. In some embodiments, the opening can have an axially-symmetric perimeter about an axis that is perpendicular to a planar surface of the substrate and pierces the planar surface at its geometric center. In other embodiments, the opening can have a perimeter that is centrosymmetric relative to that geometric center. In one example, the substrate can be embodied in the substrate 110 (FIG. 1) and the pressure wave can be embodied in the pressure wave 106 (FIG. 1).

At block 820, a flexible plate mechanically coupled to the substrate can be formed. The flexible plate can be deformed by the pressure wave. The flexible plate can embody a diaphragm in the microelectromechanical microphone. The flexible plate can be formed from a semiconductor or an electrically conducting material. The flexible plate can be mechanically coupled to the substrate by a suspension member. The suspension member can be formed from a dielectric material. Continuing with the example mentioned in connection with block 810, the flexible plate can be embodied in the flexible plate 120 (FIG. 1) and the suspension member can be embodied in the dielectric member 114 (FIG. 1).

At block 830, a first section of a rigid plate mechanically coupled to the flexible plate can be formed. The rigid plate defines multiple openings that permit passage of a fluid that transports the pressure wave. The rigid plate can be formed from a semiconductor or an electrically conducting material. The rigid plate can embody a backplate in the microelectromechanical microphone. The rigid plate can be mechanically coupled to the flexible plate by a second suspension member. The second suspension member can be formed from a dielectric material. Further to example mentioned in connection with block 810 and block 820, the rigid plate can embody the rigid plate 130 (FIG. 1). In another example, the rigid plate can embody the rigid plate 410 (FIG. 4).

At block 840, a stiffener member covering a portion of the first section of the rigid plate can be formed. The stiffener member can be formed from a dielectric material, such as silicon oxide. The stiffener member can be embodied in the stiffener member 420 (FIG. 4), for example.

At block 850, a second section of the rigid plate can be formed. The second section covers the stiffener member, resulting in a stiffener member that is buried within the rigid plate (see FIG. 4 for an illustration). The stiffener member causes distribution of stress in the rigid plate in response to the pressure wave including a threshold amplitude. As mentioned, the threshold amplitude represents a threshold pressure. As an illustration, the threshold pressure can be in a range from about 6 bar to 10 bar. In some cases, the threshold pressure can about 7 bar. In other cases, the threshold pressure can be about 8 bar.

Implementation of block 830, block 840, and block 850 results in the integration of the stiffener member into the rigid plate. That is, implementing blocks 830 to 850 constitutes integrating the stiffener member into the rigid plate.

Figure 9A:
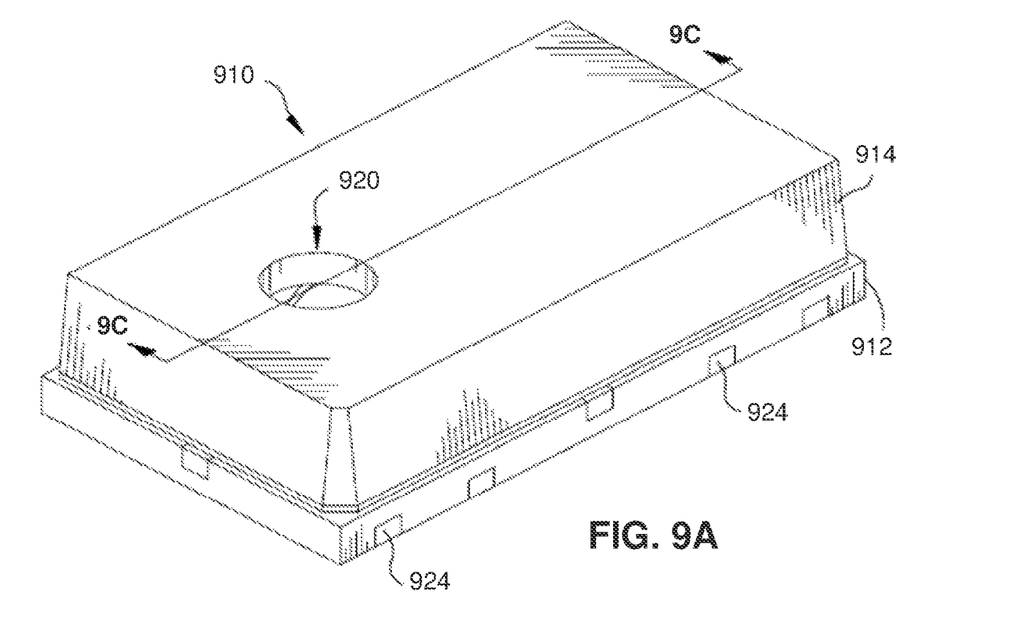
FIG. 9A illustrates a top perspective view of a packaged microphone having a microelectromechanical microphone die in accordance with one or more embodiments of this disclosure.

The microelectromechanical microphones having a stiffener member in accordance with this disclosure can be packaged for operation within an electronic device (a mobile phone, a tablet computer, or a wireless earbud, for example) or other types of devices including consumer electronics and appliances, for example. As an illustration, FIG. 9A presents a top, perspective view of a packaged microphone 910 that can include a microelectromechanical microphone die in accordance with one or more embodiments of this disclosure (such as the microelectromechanical microphone die 100 shown in FIG. 1 or the microelectromechanical microphone die 400 shown in FIG. 4). In addition, FIG. 9B presents a bottom, perspective view of the packaged microphone 910.

As is illustrated, the packaged microphone 910 has a package base 912 and a lid 914 that form an interior chamber or housing that contains a microelectromechanical microphone chipset 916. In addition, or in other embodiments, such a chamber can include a separate microphone circuit chipset 918. The chipsets 916 and 918 are depicted in FIG. 9C and FIG. 9D and are discussed hereinafter. In the illustrated embodiment, the lid 914 is a cavity-type lid, which has four walls extending generally orthogonally from a top, interior face to form a cavity. In one example, the lid 914 can be formed from metal or other conductive material to shield the microelectromechanical microphone die 916 from electromagnetic interference. The lid 914 secures to the top face of the substantially flat package base 912 to form the interior chamber.

As is illustrated, the lid 914 can have an audio input port 920 that is configured to receive audio signals (e.g., audible signals and/or ultrasonic signals) and can permit such signals to ingress into the chamber formed by the package base 912 and the lid 914. In additional or alternative embodiments, the audio port 920 can be placed at another location. For example, the audio port 912 can be placed at the package base 912. As another example, the audio port 912 can be placed at one of the side walls of the lid 914. Regardless of the location of the audio port 912, audio signals entering the interior chamber can interact with the microelectromechanical microphone chipset 916 to produce an electrical signal representative of at least a portion of the received audio signals. With additional processing via external components (such as a speaker and accompanying circuitry), the electrical signal can produce an output audible signal corresponding to an input audible signal contained in the received audio signals.

Figure 9B:
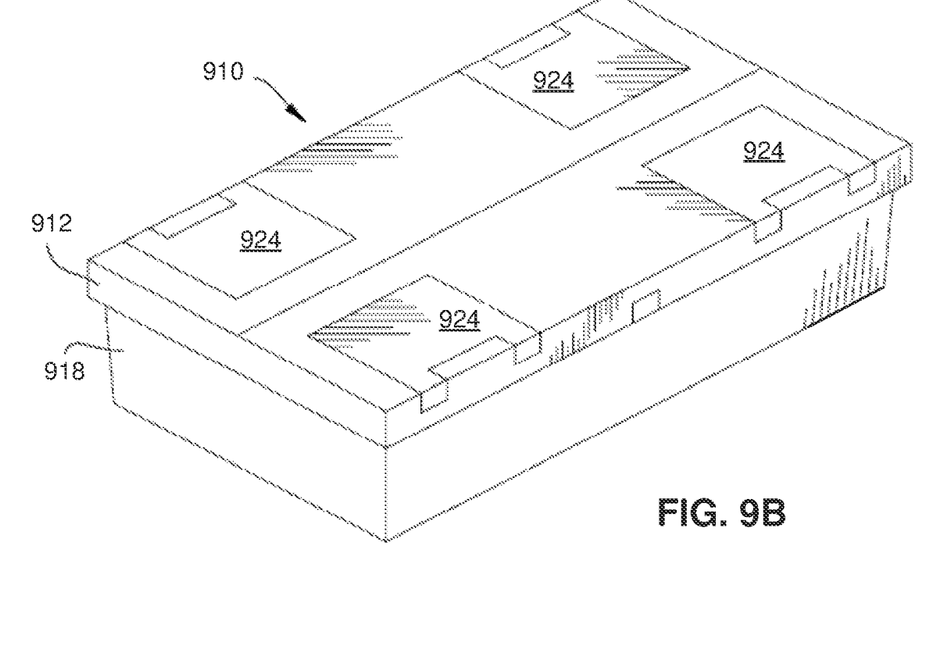
FIG. 9B illustrates a bottom perspective view of the packaged microphone illustrated in FIG. 9A.
Figure 9C:
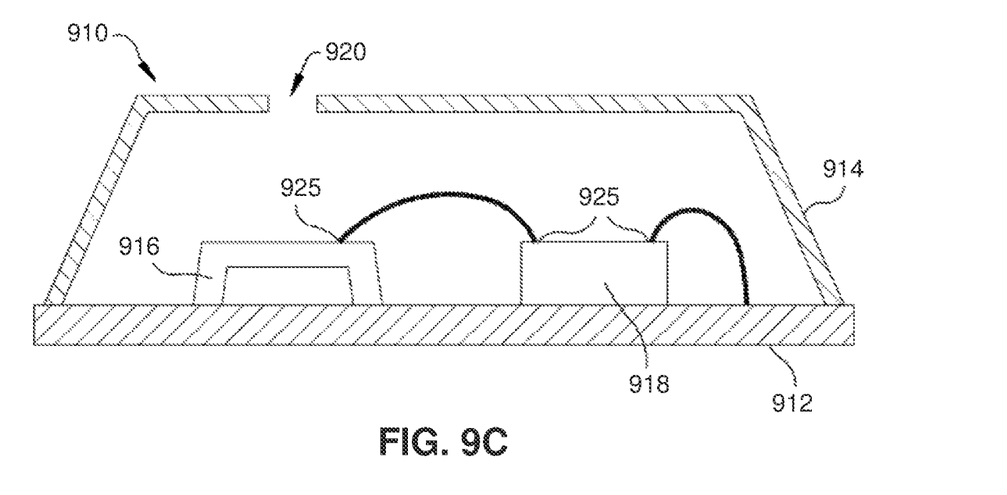
FIG. 9C illustrates a cross-sectional view of the packaged microphone illustrated in FIG. 9A.
Figure 9D:
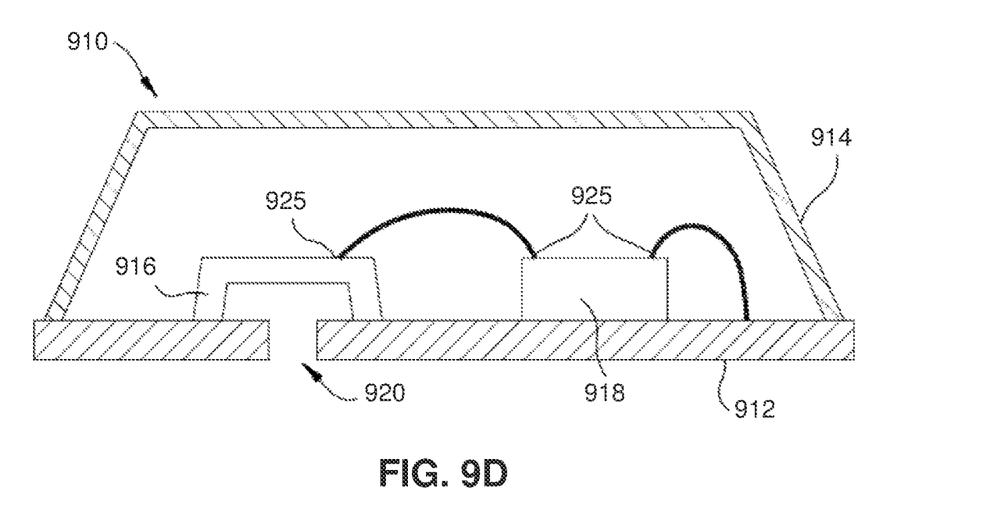
FIG. 9D illustrates a cross-sectional view of another example of a packaged microphone having a microelectromechanical microphone die in accordance with one or more embodiments of this disclosure.

FIG. 9B presents an example of a bottom face 922 of the package base 912. As illustrated, the bottom face 922 has four contacts 924 for electrically (and physically, in many use cases) connecting the microelectromechanical microphone chipset 916 with a substrate, such as a printed circuit board or other electrical interconnect apparatus. Although four contacts 924 are illustrated, the disclosure is not limited in that respect and other number of contacts can be implemented in the bottom face 922. The packaged microphone 910 can be used in any of a wide variety of applications. For example, the packaged microphone 910 can be used with mobile telephones, landline telephones, computer devices, video games, hearing aids, hearing instruments, biometric security systems, two-way radios, public announcement systems, and other devices that transduce acoustic signals. In a particular implementation, the packaged microphone 910 can be used within a speaker to produce audible signals from electrical signals.

In certain embodiments, the package base 912 shown in FIG. 9A and FIG. 9B can be embodied in, or can contain, a printed circuit board material, such as FR-4, or a premolded, leadframe-type package (also referred to as a "premolded package"). Other embodiments may use or otherwise leverage different package types, such as ceramic cavity packages. Therefore, it is noted that this disclosure is not limited to a specific type of package.

FIG. 9C illustrates a cross-sectional view of the packaged microphone 910 across line 9C-9C in FIG. 9A. As illustrated and discussed herein, the lid 914 and base 912 form an internal chamber or housing that contains a microelectromechanical microphone chipset 916 and a microphone circuit chipset 918 (also referred to as "microphone circuitry 918") used to control and/or drive the microelectromechanical microphone chipset 916. In certain embodiments, electronics can be implemented as a second, stand-alone integrated circuit, such as an application specific integrated circuit (e.g., an "ASIC die 918") or a field programmable gate array (e.g., "FPGA die 918"). It is noted that, in some embodiments, the microelectromechanical microphone chipset 916 and the microphone circuit chipset 918 can be formed on a single die.

Adhesive or another type of fastening mechanism can secure or otherwise mechanically couple the microelectromechanical microphone chipset 916 and the microphone circuit chipset 918 to the package base 912. Wirebonds or other type of electrical conduits can electrically connect the microelectromechanical microphone chipset 916 and microphone circuit chipset 918 to contact pads (not shown) on the interior of the package base 912.

While FIGS. 9A to 9C illustrate a top-port packaged microphone design, some embodiments can position the audio input port 920 at other locations, such as through the package base 912. For instance, FIG. 9D illustrates a cross-sectional view of another example of a packaged microphone 910 where the microelectromechanical microphone chipset 916 covers the audio input port 920, thereby producing a large back volume. In other embodiments, the microelectromechanical microphone chipset 916 can be placed so that it does not cover the audio input port 920 through the package base 912.

It is noted that the present disclosure is not limited with respect to the packaged microphone 910 illustrated in FIGS. 9A to 9D. Rather, discussion of a specific packaged microphone is for merely for illustrative purposes. As such, other microphone packages including a microelectromechanical microphone having a stiffener member in accordance with this disclosure are contemplated herein.

Various aspects of the embodiments of this disclosure are described herein with reference to flowchart illustrations and/or block diagrams of methods. The flowchart and block diagrams in the Figures illustrate the architecture, functionality, and operation of possible implementations of devices, methods, and products according to various embodiments of this disclosure. In this regard, each block in the flowchart or block diagrams can represent one or several operations for implementing the specified function(s). In some implementations, the functions noted in the blocks can occur out of the order noted in the Figures. For example, two blocks shown in succession can, in fact, be implemented substantially concurrently, or the blocks can sometimes be implemented in the reverse order.

In the present specification, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should generally be construed to mean "one or more" unless specified otherwise or clear from context to be directed to a singular form.

In addition, the terms "example" and "such as" are utilized herein to mean serving as an instance or illustration. Any embodiment or design described herein as an "example" or referred to in connection with a "such as" clause is not necessarily to be construed as preferred or advantageous over other embodiments or designs. Rather, use of the terms "example" or "such as" is intended to present concepts in a concrete fashion. The terms "first," "second," "third," and so forth, as used in the claims and description, unless otherwise clear by context, is for clarity only and doesn't necessarily indicate or imply any order in time.

What has been described above includes examples of one or more embodiments of the disclosure. It is, of course, not possible to describe every conceivable combination of components or methodologies for purposes of describing these examples, and it can be recognized that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A microelectromechanical microphone device, the microphone device comprising:
   a rigid plate defining multiple openings configured to permit passage of a pressure wave; and
   a stiffener member integrated into the rigid plate,
   wherein the stiffener member is configured to cause stress to be distributed within the rigid plate in response to the pressure wave inducing deformation of the rigid plate,
   wherein the stiffener member is buried within the rigid plate, the stiffener member forming an interface with a portion of the rigid plate,
   wherein the stiffener member comprises one of a metal or an alloy of a first metal and a second metal, and
   wherein the alloy of the first metal and the second metal comprises AlCu.

2. The microelectromechanical microphone device of claim 1, wherein the stiffener member overlays a portion of the rigid plate, the stiffener member forming a substantially planar interface with the portion of the rigid plate.

3. The microelectromechanical microphone device of claim 1, wherein the rigid plate comprises a first material, wherein the stiffener member comprises a second material, and wherein a Young's modulus of the first material being less than a Young's modulus of the second material.

4. The microelectromechanical microphone device of claim 1, wherein the rigid plate is mechanically coupled to a flexible plate by a dielectric member that extends between the rigid plate and the flexible plate, and wherein the stiffener member is configured to cause a magnitude of stress at a suspension interface between the rigid plate and the dielectric member to be reduced by about 30% to about 50% relative to a second magnitude of the stress in absence of the stiffener member.

5. The microelectromechanical microphone device of claim 1, wherein the stiffener member has axial symmetry relative to an axis that is perpendicular to the rigid plate and pierces a geometric center of the rigid plate, the stiffener member having a width in a range from about 5 µm to about 20 µm.

6. The microelectromechanical microphone device of claim 1, wherein the stiffener member has a uniform thickness having a magnitude in a range from about 1 µm to about 10 µm.

7. The microelectromechanical microphone device of claim 1, wherein the stiffener member comprises a dielectric material.

8. The microelectromechanical microphone device of claim 7, wherein the dielectric material comprises one of silicon nitride, aluminum nitride, an alkali halide, lithium fluoride, barium titanate, lead titanate or a semiconductor material.

9. The microelectromechanical microphone device of claim 7, wherein the dielectric material comprises one of alumina, silicon monoxide, silicon dioxide, titanium dioxide, hafnium dioxide, tantalum oxide, tungsten oxide, or zirconium dioxide.

10. A method comprising:
    forming a rigid plate defining multiple openings for permitting passage of a pressure wave; and
    integrating a stiffener member into the rigid plate,
    wherein the stiffener member is able to cause stress to be distributed within the rigid plate in response to the pressure wave inducing deformation of the rigid plate,
    wherein integrating the stiffener member into the rigid plate comprises forming the stiffener member during formation of the rigid plate,
    wherein forming the rigid plate comprises forming a first section of the rigid plate,
    wherein forming the stiffener member comprises depositing an amount of a first material onto a portion of the first section of the rigid plate,
    wherein the rigid plate comprises polycrystalline silicon, and
    wherein depositing the amount of the first material comprises depositing an oxide of silicon.

11. The method of claim 10, wherein forming the rigid plate further comprises forming a second section of the rigid plate covering the stiffener member.

12. The method of claim 10, wherein the rigid plate comprises a second material, and wherein a Young's modulus of the first material is greater than a Young's modulus of the second material.

13. A device comprising:
    a microelectromechanical microphone device comprising:
        a rigid plate mechanically defining multiple openings configured to permit passage of a pressure wave; and
        a stiffener member integrated into the rigid plate, wherein the stiffener member is configured to cause stress to be distributed within the rigid plate in response to the pressure wave inducing deformation of the rigid plate, and wherein the stiffener member is buried within the rigid plate, the stiffener member forming an interface with a portion of the rigid plate; and
    a circuit coupled to the microelectromechanical microphone device and,
    wherein the circuit is configured to:
        receive a first signal indicative of a capacitance representative of an amplitude of the pressure wave, and
        generate a second signal representative of the amplitude of the pressure wave, and
    wherein the rigid plate comprises polycrystalline silicon, and wherein the stiffener member comprises an oxide of silicon.

14. The device of claim 13, wherein the rigid plate comprises a first material and the stiffener member comprises a second material, and wherein a Young's modulus of the first material is less than a Young's modulus of the second material.

* * * * *